United States Patent
Wixon et al.

[11] Patent Number: 6,090,444
[45] Date of Patent: Jul. 18, 2000

[54] BASE PLATER OR VACUUM DEPOSITION APPARATUS WITH INDIVIDUALLY AND SELECTIVELY CONTROLLED WORK HOLDERS AND CAPACITIVELY COUPLED CRYSTAL MONITOR

[75] Inventors: Ronald K. Wixon, Phoenix; James R. Fitzsimons, Cave Creek, both of Ariz.

[73] Assignee: Saunders & Associates, Inc., Scottsdale, Ariz.

[21] Appl. No.: 09/246,427

[22] Filed: Feb. 8, 1999

[51] Int. Cl.[7] .................................................. C23C 14/00
[52] U.S. Cl. ..................................... 427/255.5; 427/248.1; 118/715; 118/721; 118/722; 118/730
[58] Field of Search .............................. 427/255.5, 248.1; 118/715, 720, 721, 730

[56] References Cited

U.S. PATENT DOCUMENTS

| | | | |
|---|---|---|---|
| 2,260,471 | 10/1941 | McLeod | 91/12.2 |
| 2,410,720 | 11/1946 | Dimmick | 91/12.2 |
| 4,121,537 | 10/1978 | Maruyama et al. | 118/7 |
| 4,207,836 | 6/1980 | Nonaka | 118/664 |
| 4,763,340 | 8/1988 | Yoneda et al. | 375/121 |
| 4,817,559 | 4/1989 | Ciparisso | 118/731 |
| 4,918,737 | 4/1990 | Luethi | 381/68.4 |
| 5,026,469 | 6/1991 | Kunkel et al. | 204/298.15 |
| 5,064,522 | 11/1991 | Wellerdieck | 204/298.28 |
| 5,138,974 | 8/1992 | Ciparisso | 118/731 |
| 5,154,810 | 10/1992 | Kamerling et al. | 204/192.13 |
| 5,403,400 | 4/1995 | Nishiguchi | 118/723 EB |
| 5,474,641 | 12/1995 | Otsuki et al. | 156/345 |
| 5,558,909 | 9/1996 | Poliquin et al. | 427/251 |

*Primary Examiner*—Richard Bueker
*Attorney, Agent, or Firm*—Harry M. Weiss; Jeffrey Weiss; Paul W. Davis

[57] ABSTRACT

A base plater or a vacuum deposition apparatus 24 having individually and selectively controlled work holders 10 and a capactively coupled crystal monitor 26. A flipping control mechanism 31 individually and selectively controls flipping of each of the work holders 10 by selectively engaging a flip lever 32 to a flip gear 14 of each work holder 10. The flipping control mechanism 31 allows individual and selective rotation of the work holders 10 to plating and non-plating positions for particular plating processes or runs. Rings 28, 36, 40, and 42 are used to provide a generally open central area 60 that is generally free from obstructions that may adversely affect the plating process and/or the surface or components of the base plater apparatus 24. A crystal monitor 26 is mounted to rotational ring 28 which is in the same rotational plane and periphery of the work holders 10. The crystal monitor 26 is capacitvely coupled to a control circuit 58 via capacitor rings 40 and 42 wherein a capacitive gap 68 exists therebetween.

36 Claims, 5 Drawing Sheets

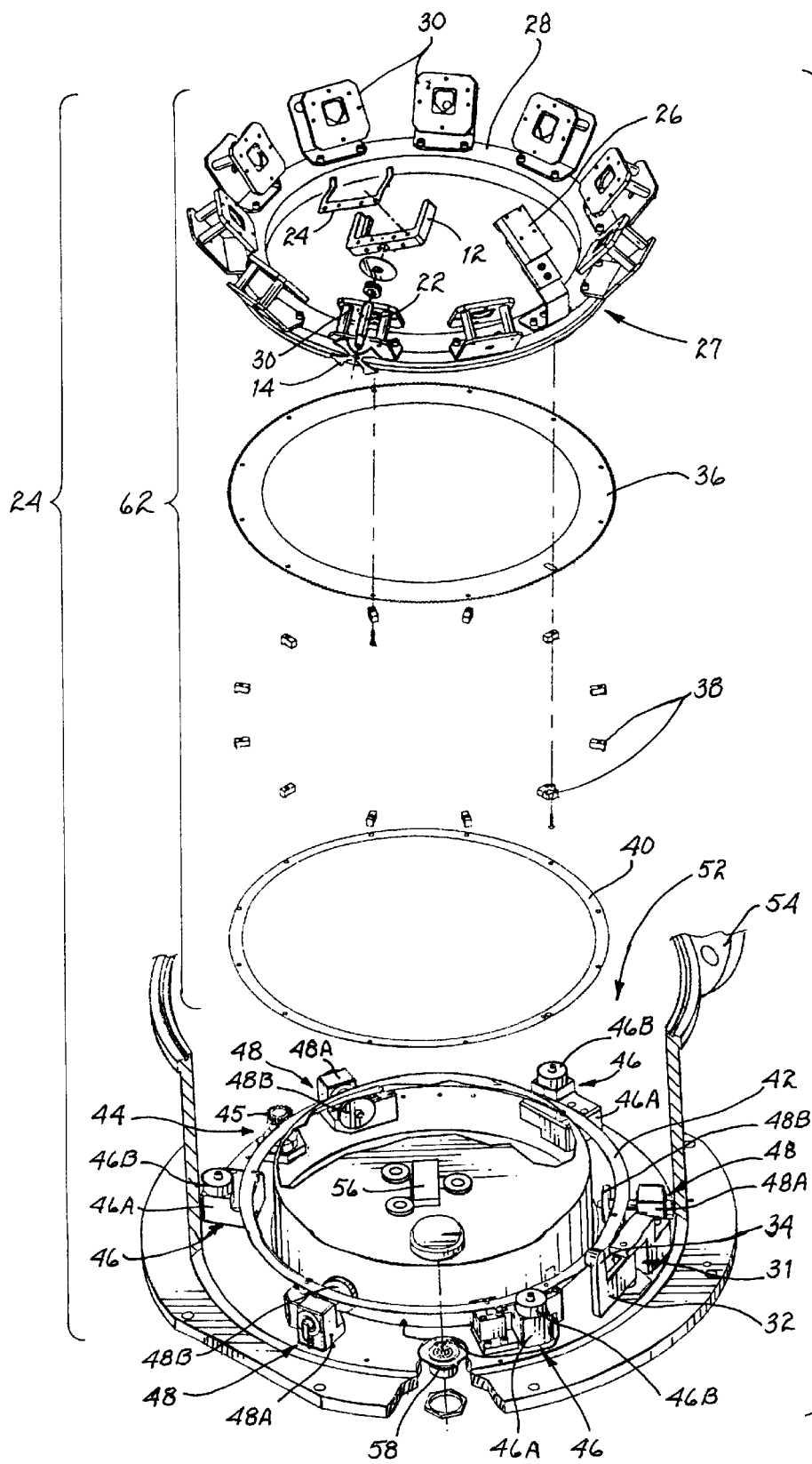

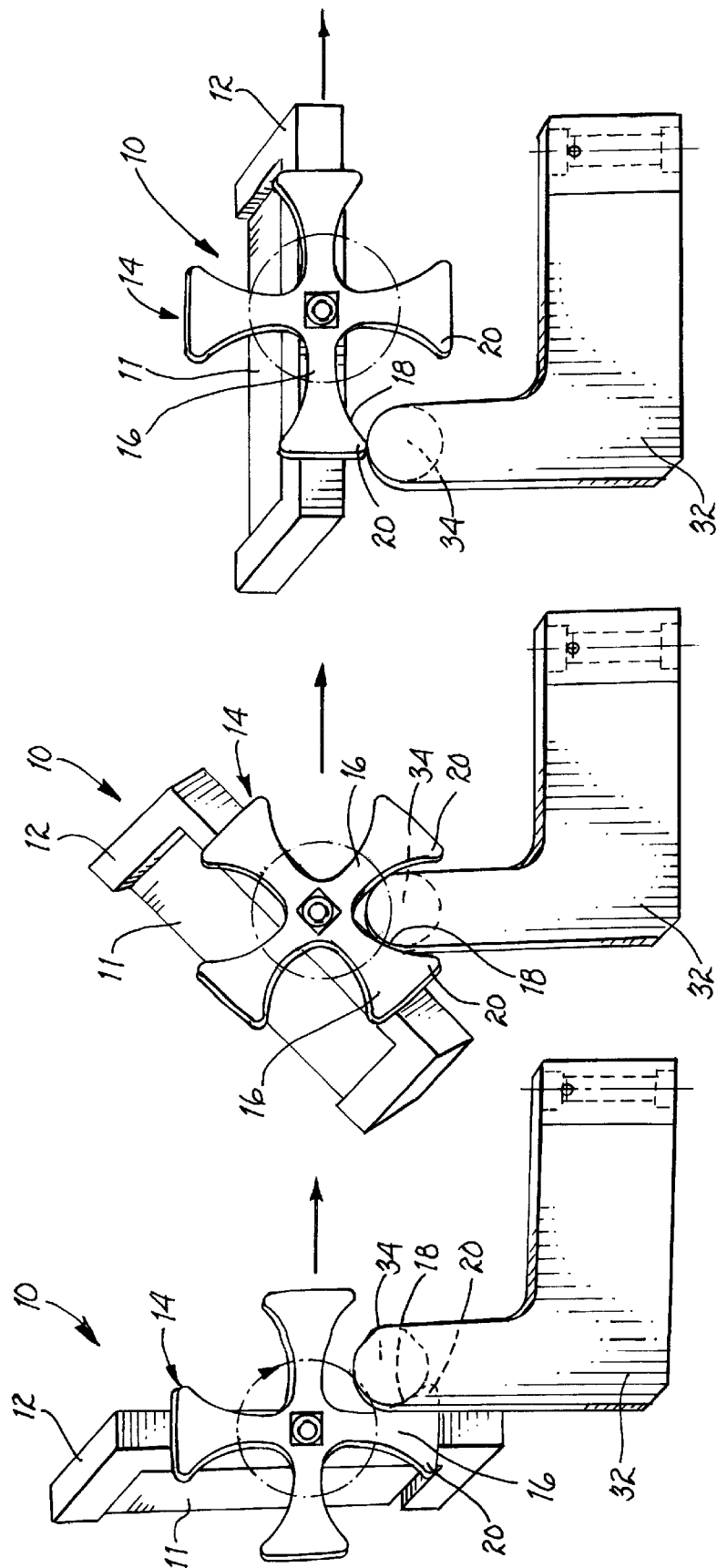

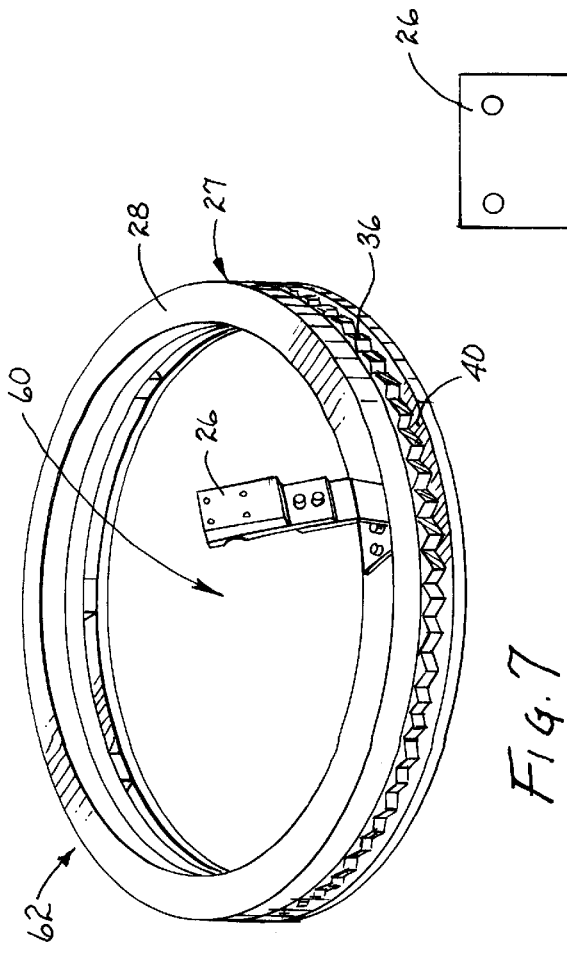
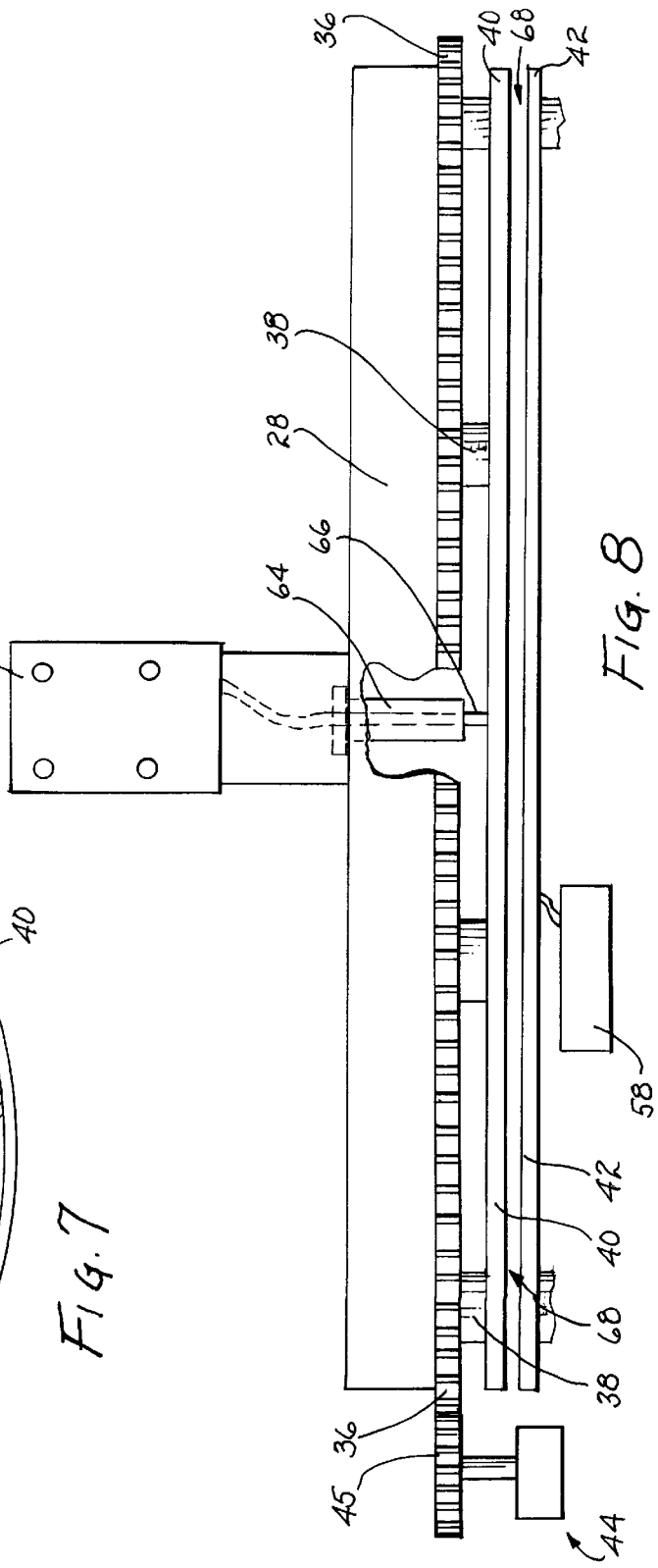

BASE PLATER OR VACUUM DEPOSITION APPARATUS WITH INDIVIDUALLY AND SELECTIVELY CONTROLLED WORK HOLDERS AND CAPACITIVELY COUPLED CRYSTAL MONITOR

FIELD OF INVENTION

The present invention relates to a base plater or vacuum deposition apparatus, and, in particular, to a base plater or vacuum deposition apparatus with individually and selectively controlled work holders and a capacitively coupled crystal monitor.

BACKGROUND OF INVENTION AND BRIEF DESCRIPTION OF THE PRIOR ART

Base platers or vacuum deposition apparatuses are used in the semiconductor industry to deposit plating materials onto substrates that are placed within a mask. Conventional base platers typically have mask holders to hold and carry a number of masks with substrates on a turntable or rotatable plate so that plating materials from a plating apparatus are evenly deposited onto the surfaces of the substrates. Examples of such conventional base platers are disclosed in U.S. Pat. Nos. 4,207,836; 4,121,537; 5,474,641; 5,403,400; 5,154,810. These prior art patents are incorporated by reference herein. These turntables or rotatable plates are each typically supported and rotated by a centrally positioned shaft and span a surface area in the central area. The central areas of these turntables or rotatable plates are occupied with at least some components or surface area. However, deposit materials may come into contact and adhere to these surfaces and components, which is undesirable since periodic cleaning would be required and the components may become damaged or lose life expectancy. However, it is needed and desired to minimize exposure of deposit materials to these respective surfaces and components. It is also needed and desired to maintain central areas of the rotatable plate free from exposable surfaces and components as much as possible since deposit materials are usually bombarded at these central areas.

Base platers or vacuum deposition apparatuses that rotate or flip the mask holders so that both sides of the masked substrates are able to be plated exist. The problem with these prior art base platers or vacuum deposition apparatuses is that the mask holders are only able to be all simultaneously flipped or rotated to either one platable side of each of the masked substrates or the other platable side of each of the masked substrates. In other words, these platers or apparatuses are able to only place the masked substrates in platable positions and are not able to place them into non-platable positions during the plating process or plating run. These base platers or vacuum deposition apparatuses also cannot individually and selectively control position of each of the masked substrates, and they also cannot selectively control the amounts of material being deposited on each masked substrate. Therefore, for those situations in which masked substrates require different amounts of deposit material, these prior art base platers or vacuum deposition apparatuses would require separate or additional plating runs or in order to obtain the desired plating results. Also, inefficiencies exist with these prior art platers and apparatuses since situations in which only a partial number of mask holders are occupied by masked substrates during a plating run may occur. These separate and additional runs and inefficiencies of the prior art base platers and apparatuses increase the overall plating process, number of runs, time, and costs.

A crystal quartz monitor is typically coupled to a base plater to monitor and measure the amount of plating material being deposited onto the substrates. The crystal monitor is generally mounted in a stationary position above the masks and plating nozzles. The crystal monitor may be typically mounted to the lid or cover of the base plating machine or base plater. However, an inherent degree of inaccuracy or offset exists in the conventional method of plating measurement because the crystal monitor is mounted in a fixed position above the plane of the rotating masks. Therefore, calculations have been made necessary to adjust for the inaccurate measurements, but these calculations require programming and may still have a certain level(s) of error or inaccuracy.

Prior art methods and apparatuses of mounting crystal monitors have been developed to overcome the offset/inaccurate problem. Examples of such prior art methods and apparatuses that are able to overcome this problem are disclosed in U.S. Pat. Nos. 4,121,537; 4,207,836; 5,064,522. These prior art patents are incorporated by reference herein. These prior art methods and apparatuses generally teach the mounting of the crystal monitor onto the rotatable plate. The main problem with such mounting is that electrical coupling needs to be achieved between the crystal monitor and a control circuit that is not mounted on the rotatable plate but mounted at a generally stationary location. Some of these prior art methods and apparatuses overcome the electrical coupling problem by capacitively and/or inductively coupling the crystal monitor and the control circuit together via a centrally located shaft and coupling components. The shaft and coupling components that are centrally located on the rotatable plate are undesirable and problematic for the reasons stated earlier above, that is, the shaft and components are centrally located and generally exposable to the deposit materials from the plater.

Therefore, the present invention discloses and provides a base plater and a vacuum deposition chamber having a rotatable ring and a stationary ring wherein the rotatable ring rotates relative to the stationary ring and wherein the rings each have generally open and free central areas. Furthermore, the present invention discloses and provides individually and selectively controlled work holders coupled to the rotatable ring wherein the work holders are each able to be individually and selectively controlled between plating and non-plating positions. Also, the present invention discloses and provides a crystal monitor mounted to the rotatable ring at a general periphery and capacitively coupled to a control circuit via rotating the rotatable ring relative to a stationary ring. The present invention overcomes the problems, disadvantages, and limitations of the prior art.

SUMMARY OF INVENTION

Set forth is a brief summary of the invention in order to solve the foregoing problems and achieve the foregoing and other objects, benefits, and advantages in accordance with the purposes of the present invention as embodied and broadly described herein.

It is an object of the invention to provide base platers or vacuum deposition apparatuses and components that have rotatable plates wherein the rotatable plates have less or minimal surface area on which deposit materials are able to be exposed.

It is another object of the invention to provide base platers or vacuum deposition apparatuses and components that require less cleaning and provide longer life for the components.

It is another object of the invention to provide base platers or vacuum deposition apparatuses that are able to individually and selectively control position of each of the masked substrates or work pieces.

It is a further object of the invention to provide base platers or vacuum deposition apparatuses that are able to selectively control amounts of material being deposited on each masked substrate or work piece.

It is still another object of the invention to provide base platers or vacuum deposition apparatuses that are able to individually and selectively control each of the masked substrate or work piece in either a plating position or a non-plating position for a plating process or run.

It is an object of the invention to mount a crystal monitor for a base plater or vacuum deposition apparatus wherein the crystal monitor more accurately monitors the material being deposited on the substrates or work pieces.

It is another object of the invention to mount the crystal monitor to a base plater or vacuum deposition chamber and capacitively couple the crystal monitor to a control circuit such that open and free central areas still generally exist at or near the rotatable plate of the base plater or vacuum deposition chamber.

It is a further object of the invention to mount the crystal monitor and the substrates or work pieces to a base plater or vacuum deposition chamber at a generally peripheral location and to capacitively couple the crystal monitor to a control circuit at the generally peripheral location.

It is an object of the invention to generally make the plating process more cost effective and require less time or number of runs to achieve the same or desired level of plating.

The above objects and advantages of the invention are achieved by a selectively rotatable work holder for a base plater or a vacuum deposition apparatus. The work holder comprises a rotatable mask holder and a flip gear. The rotatable mask holder is able to rotatably couple to a rotatable driven plate of the base plater or the vacuum deposition apparatus. The rotatable mask holder is able to hold at least one mask or work piece and be selectively rotated between at least one plating position and at least one non-plating position. The flip gear has at least one engaging member. The flip gear is coupled to the rotatable mask holder, and the at least one engaging member is able to receive and be selectively engaged by a flipper lever for selectively flipping the rotatable mask holder.

A rotational shaft is able to rotatably couple to the rotatable driven plate. One end of the shaft is coupled to the flip gear and another end of the shaft is coupled to the rotatable mask holder. An engaging edge of the at least one engaging member is able to contact the flip lever to rotate the flip gear. The engaging edge further comprises at least one flipper lobe for guiding and positioning the flipper gear so that the rotatable mask holder is placed in a properly rotated position. The at least one engaging member may be four engaging members, and the four engaging members may be configured and spaced apart to form a generally cross shape. The four engaging members are configured and spaced apart such that the rotatable mask holder is able to rotate in generally ninety degree increments. The generally ninety degree increments define the at least one plating position and the at least one non-plating position for the rotatable mask holder. A mask holder bracket is mountable to the rotatable driven plate of the base plater or the vacuum deposition apparatus. The rotatable mask holder and the flip gear are rotatably coupled to the mask holder bracket.

The above objects and advantages of the invention are also achieved by a capactive coupling device for coupling a rotating electronic device to a control circuit of a base plater or a vacuum deposition apparatus. The coupling device comprises a rotating capacitor ring and a stationary capacitor ring. The rotating capacitor ring has a generally central open area wherein the rotating electronic device is able to couple to the rotating ring. The stationary capacitor ring has a generally central open area wherein the stationary ring is able to couple to the control circuit. The rotating capacitor ring is positioned and rotated relative to the stationary ring. A capacitive coupling gap exists between the rotating capacitor ring and the stationary ring, and the rotating electronic device is able to be rotated and also be capacitively coupled to the control circuit. At least one rotational driving mechanism is drivingly coupled to the rotating capacitor ring for rotating the rotating capacitor ring. The at least one rotational driving mechanism is drivingly coupled at a general periphery of the rotating capacitor ring.

The above objects and advantages of the invention are further achieved by a base plater or a vacuum deposition apparatus that comprises a vacuum deposition chamber for plating masked substrates or work pieces, a lid coupled to the vacuum deposition chamber, a plating apparatus located within the vacuum deposition chamber so that the plating apparatus is able to plate and deposit material on the masked substrates or work pieces, a rotational driving apparatus coupled to a rotational driving mechanism, at least one work holder apparatus coupled to the rotational driving apparatus wherein the at least one work holder comprises at least one selectively rotatable work holder, and at least one flipper control mechanism selectively engagable to the at least one selectively rotatable work holder for selectively rotating the at least one selectively rotatable work holder between at least one plating position and at least one non-plating position. The rotational driving apparatus further comprises a rotatable driven plate. Each of the at least one selectively rotatable work holder further comprises a rotatable mask holder and a flip gear. The rotatable mask holder is rotatably coupled to the rotatable driven plate wherein the rotatable mask holder is able to hold at least one mask or work piece and is able to be selectively rotated between at least one plating position and at least one non-plating position. The flip gear has at least one engaging member wherein the flip gear is coupled to the rotatable mask holder. The at least one engaging member is able to receive and be engaged by the flipper control mechanism for flipping the rotatable mask holder. A rotational shaft is rotatably coupled to the rotatable driven plate. One end of the shaft is coupled to the flip gear and another end of the shaft is coupled to the rotatable mask holder. An engaging edge of the at least one engaging member is engagable to the flipper control mechanism to rotate the flip gear. The engaging edge further comprises at least one flipper lobe for guiding and positioning the flipper gear so that the rotatable mask holder is placed in a properly rotated position.

A mask holder bracket is mounted to the rotatable driven plate wherein the rotatable mask holder and the flip gear are rotatably coupled to the mask holder bracket. The flipper control mechanism further comprises an actuating mechanism that is selectively controlled and a flip lever coupled to the actuating mechanism. The actuating mechanism selectively activates the flip lever to engage and flip the at least one selectively rotatable work holder. The actuating mechanism also selectively deactivates the flip lever to disengage the at least one selectively rotatable work holder. The at least one selectively rotatable work holder is a plurality of selectively rotatable work holders, and each of the plurality of selectively rotatable work holders is individually and selectively controlled in position by selectively controlling the flipper control mechanism.

A capactive coupling device couples a rotating electronic device to a control circuit. The capacitive coupling device further comprises a rotating capacitor ring and a stationary capacitor ring wherein the rotating capacitor ring is positioned and rotated relative to the stationary ring. A capacitive coupling gap exists between the rotating capacitor ring and the stationary ring, and the rotating electronic device is able to be rotated and also be capactively coupled to the control circuit. The rotational driving mechanism is drivingly coupled to the rotating capacitor ring for rotating the rotating capacitor ring at a general periphery. Also, the rotational driving mechanism is drivingly coupled at a general periphery of the rotational driving apparatus.

The above objects and advantages of the invention are also achieved by a base plater or a vacuum deposition apparatus that comprises a vacuum deposition chamber for plating masked substrates or work pieces, a lid coupled to the vacuum deposition chamber, a plating apparatus located within the vacuum deposition chamber so that the plating apparatus is able to plate and deposit material on the substrates or the work pieces, a rotational driving apparatus coupled to a rotational driving mechanism, at least one work holder apparatus coupled to the rotational driving apparatus, a rotating electronic device coupled to the rotational driving apparatus, a control circuit for controlling operations of the base plater or the vacuum deposition apparatus, and a capactive coupling device for coupling the rotating electronic device to the control circuit. The capacitive coupling device further comprises a rotating capacitor ring and a stationary capacitor ring. The rotating capacitor ring is positioned and rotated relative to the stationary ring. A capacitive coupling gap exists between the rotating capacitor ring and the stationary ring, and the rotating electronic device is able to be rotated and also be capactively coupled to the control circuit. The rotational driving mechanism is drivingly coupled at a general periphery of the rotating capacitor ring.

The above objects and advantages of the invention are further achieved by a method of using a base plater or a vacuum deposition apparatus having a vacuum deposition chamber for plating masked substrates or work pieces, a lid coupled to the vacuum deposition chamber, a plating apparatus located within the vacuum deposition chamber so that the plating apparatus is able to plate and deposit material on the masked substrates or work pieces, a rotational driving apparatus coupled to a rotational driving mechanism, at least one work holder apparatus coupled to the rotational driving apparatus wherein the at least one work holder comprises at least one selectively rotatable work holder, and at least one flipper control mechanism selectively engagable to at least one flip gear coupled to the at least one selectively rotatable work holder for selectively rotating the at least one selectively rotatable work holder.

The masked substrates or work pieces are mounted in the at least one selectively rotatable work holder. The rotational driving mechanism is used to rotate the rotational driving apparatus. The at least one flipper control mechanism is selectively engaged to the at least one flip gear to selectively rotate the at least one selectively rotatable work holder between at least one plating position and at least one non-plating position. The masked substrates or work pieces in the at least one selectively rotatable work holder that are in the at least one plating position are plated. The at least one flipper control mechanism are selectively engaged to the at least one flip gear to selectively rotate the at least one selectively rotatable work holder to predetermined degree increments. The predetermined degree increments define the at least one plating position and the at least one non-plating position for the rotatable mask holder. The predetermined degree increments are ninety degree increments.

The above objects and advantages of the invention are also achieved by a method of using a capacitively coupling device for coupling a rotating electronic device to an electronic circuit. The capacitive coupling device is provided with a rotating capacitor ring having a generally central open area and a stationary capacitor ring having a generally central open area. The rotating electronic device is coupled to the rotating capacitor ring. The electronic circuit is coupled to the stationary capacitor ring. The rotating capacitor ring are positioned and rotated relative to the stationary ring wherein a capacitive coupling gap exists between the rotating capacitor ring and the stationary ring and wherein the rotating electronic device is rotated and capactively coupled to the electronic circuit. The rotating capacitor ring is drivingly rotated at a general periphery.

The preferred embodiments of the inventions are described below in the Figures and Detailed Description. Unless specifically noted, it is intended that the words and phrases in the specification and claims be given the ordinary and accustomed meaning to those of ordinary skill in the applicable art or arts. If any other meaning is intended, the specification will specifically state that a special meaning is being applied to a word or phrase. Likewise, the use of the words "function" or "means" in the Detailed Description is not intended to indicate a desire to invoke the special provisions of 35 U.S.C. Section 112, paragraph 6 to define the invention. To the contrary, if the provisions of 35 U.S.C. Section 112, paragraph 6, are sought to be invoked to define the inventions, the claims will specifically state the phrases "means for" or "step for" and a function, without also reciting in such phrases any structure, material, or act in support of the function. Even when the claims recite a "means for" or "step for" performing a function, if they also recite any structure, material or acts in support of that means of step, then the intention is not to invoke the provisions of 35 U.S.C. Section 112, paragraph 6. Moreover, even if the provisions of 35 U.S.C. Section 112, paragraph 6, are invoked to define the inventions, it is intended that the inventions not be limited only to the specific structure, material or acts that are described in the preferred embodiments, but in addition, include any and all structures, materials or acts that perform the claimed function, along with any and all known or later-developed equivalent structures, materials or acts for performing the claimed function.

BRIEF DESCRIPTION OF DRAWINGS

FIG. 5 is an exploded view of the present invention base plater or vacuum deposition apparatus.

FIGS. 6A to 6C are perspective sequential views of the selectively rotatable work holder being rotated by the activated flipper lever from a non-plating position to a plating position.

FIG. 7 is a perspective view of the rotational driving apparatus mounted relative to a stationary ring for the present invention.

FIG. 8 is a side sectional view of the rotational driving apparatus according to FIG. 5.

DETAILED DESCRIPTION

Figure 1:
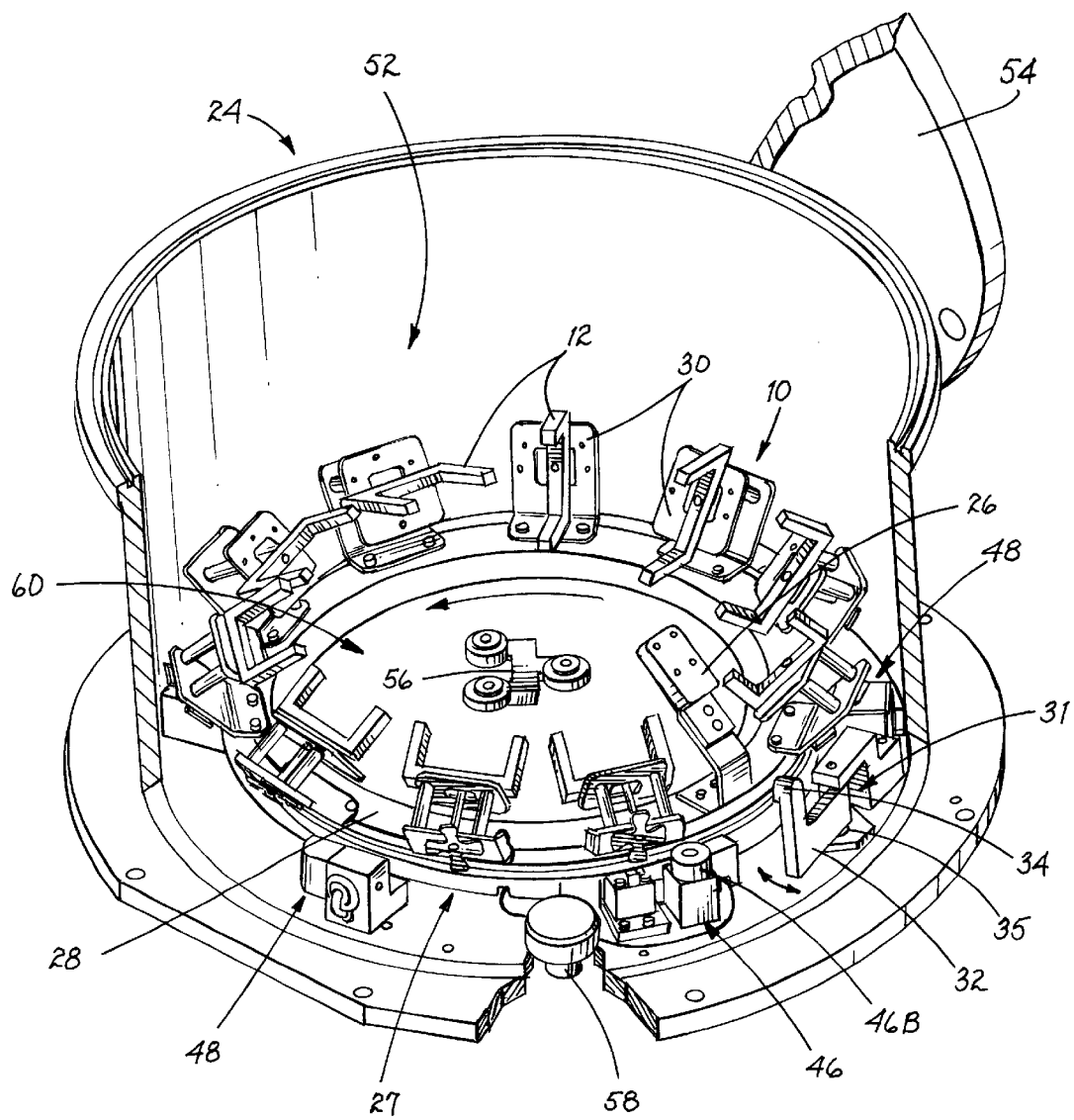
FIG. 1 is a partial perspective cutaway view of the present invention base plater or vacuum deposition apparatus.

The present invention is a base plater or vacuum deposition apparatus 24 (hereafter referred to as "base plater 24") having capacitively coupled and rotatable crystal deposition monitor 26 and independently and selectively rotatable work holders 10. FIG. 1 shows the base plater apparatus 24 having a vacuum deposition chamber 52 and coupled lid 54. A plating apparatus 56 is located centrally within the vacuum deposition chamber 52 so that the plating apparatus 56 is able to uniformly plate and deposit materials on masked substrates or work pieces 11 (i.e. shown in FIGS. 6A to 6C) held and supported by the work holders 10. A rotational driving apparatus 27 having a rotatable ring 28 or other such rotatable plate carries and rotates the work holders 10. Each work holder 10 has a rotatable mask holder 12 that holds masked substrates or work pieces 11 to be processed or plated within the chamber 52. The rotational driving apparatus 27 with its rotatable ring 28 and drive gear ring 36 (i.e. shown in FIG. 5) has a generally formed open central area 60. The work holders 10 are coupled to the rotational ring 28 so that the work holders 10 are able to revolve around the centrally located plating apparatus 56. The rotational driving apparatus 27 is supported by support rollers 46 and 48 (i.e. shown in FIG. 5) and drivingly rotated at its general periphery by a rotational driving mechanism 44 (i.e. shown in FIG. 5). Therefore, the central area 60 is generally free from obstructions that may adversely affect the plating process and/or the surface or components of the base plater apparatus 24.

Each mask holder 12 is able to be independently and selectively rotated during the plating process or plating run so that the masked substrates or work pieces 11 held therein are able to be flipped or rotated between plating positions and non-plating positions. The base plater apparatus 24 has a flipper actuating mechanism 31 that selectively actuates a flip lever 32 that is selectively engagable to each of the work holders 10 for individually and selectively controlling rotation of each of the mask holders 12 during the plating process or run. Furthermore, FIG. 1 shows a crystal monitor 26 coupled to the rotatable ring 28 to monitor the amount of material that is being deposited on the masked substrates or work pieces 11. The crystal monitor 26 is capacitively coupled to a control circuit 58 that controls operation of the base plater apparatus 24 during the plating process or run.

Figure 2:
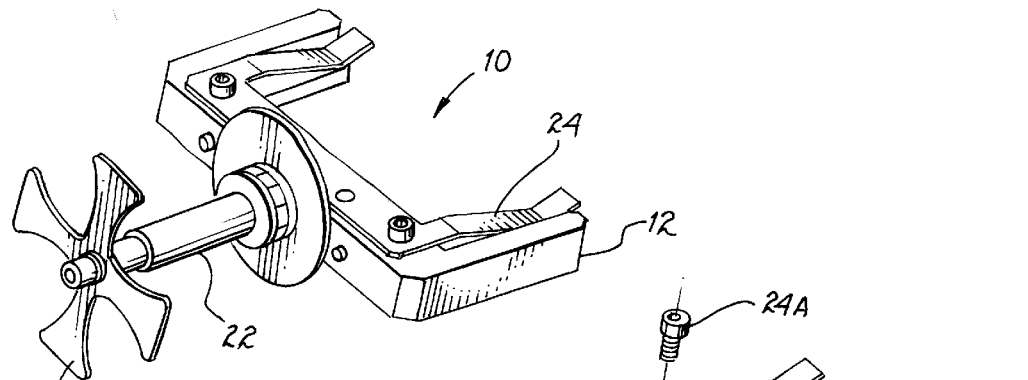
FIG. 2 is a perspective view of a selectively rotatable work holder for the present invention.
Figure 3:
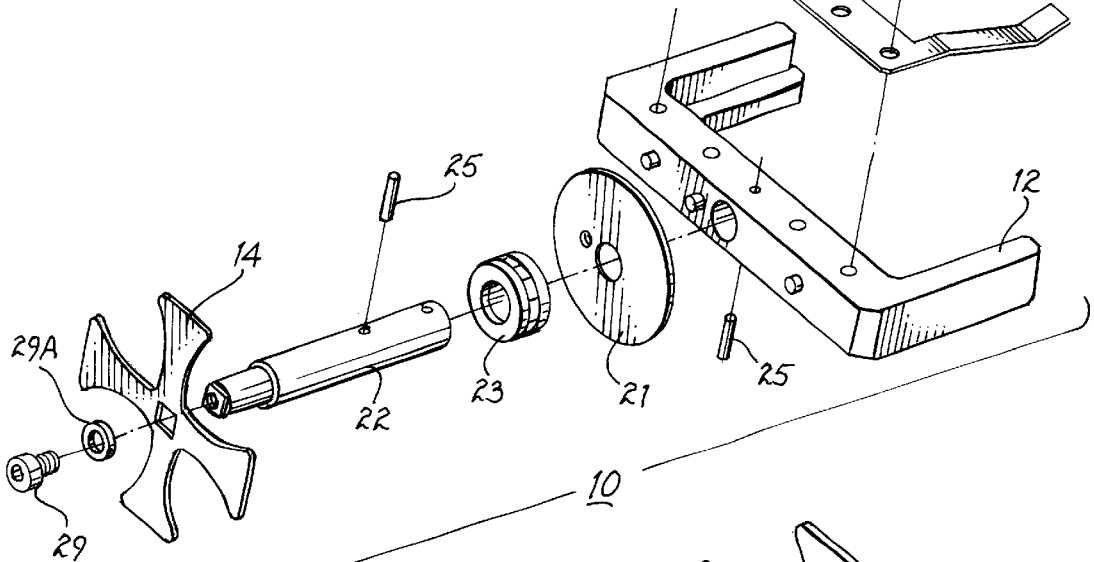
FIG. 3 is an exploded view of the selectively rotatable work holder according to FIG. 2.
Figure 4:
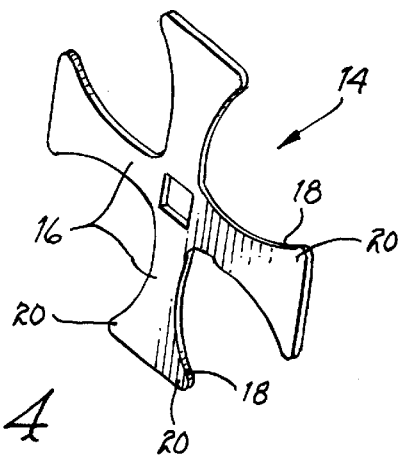
FIG. 4 is a perspective view of the flip gear for the selectively rotatable work holder.

FIGS. 2 and 3 show the components of the selectively rotatable work holder 10. The work holder 10 has a rotational shaft 22, a flip gear 14 coupled to one end of the rotational shaft 22, and a rotatable mask holder 12 coupled at another end of the rotational shaft 22. Coupling components 21 and 23 are coupled between the rotation shaft 22 and the mask holder 12. A work piece retainer 24 is coupled to the rotatable mask holder 12 by use of retainer screws 24A to retain masked substrates or work pieces 11 within the mask holder 12. Referring to FIGS. 1 and 5, the rotational shaft 22 is rotatably coupled to a mask holder bracket 30, and the mask holder bracket 30 is coupled to the rotatable ring 28. The flip gear 14 shown in FIGS. 2, 3, and 4 has four engaging members 16 that are configured and spaced apart to form a generally cross shape. Each engaging member 16 has at least one engaging edge 18. The engaging edge 18 is able to contact or be engaged by an engaging portion 34 of the flip lever 32 to rotate the flip gear 14 and mask holder coupled thereto (i.e. see FIGS. 6A to 6C). Flipper lobes 20 are located on each engaging member wherein the flipper lobes 20 guide and position the flipper gear 14 so that the rotatable mask holder 12 is placed in a properly rotated position. Pins 25 may be used to couple the components of the rotatable work holder 10 together. Retainer screw 29 with washer 29A are secured at the one end to hold the flip gear 14 to shaft 22.

FIG. 5 is an exploded view showing the relative positioning of the components and parts of the base plater apparatus 24. Work holders 10 and the crystal monitor 26 are mounted to the rotational driving apparatus 27 as shown in FIG. 5. The rotational driving apparatus 27 includes a rotatable ring 28 with a drive gear ring 36 coupled thereto. The periphery of the drive gear ring 36 is engagable to the drive gear 45 of a rotational driving mechanism 44 to drivingly rotate the rotational driving apparatus 27 and rotatable ring 28. A rotating capacitor ring 40 is coupled to a generally lower portion of the rotational driving apparatus 27 and isolating spacers 38 are positioned between the drive gear ring 36 and the capacitor ring 40 to isolate electrical contact therebetween.

Within the lower portion of the chamber 52 of base plater apparatus 24, horizontal roller support assemblies 46 and vertical roller support assemblies 48 are located and mounted generally at the bottom of the chamber 52 and at various general locations along the inner periphery of the chamber 52. The horizontal roller support assemblies 46 each have a chamber mount 46A and a horizontal roller wheel 46B. The vertical roller support assemblies 48 each have a chamber mount 48A and a vertical roller wheel 48B. A stationary capacitor ring 42 is mounted generally at the bottom of the chamber 52. The stationary capacitor ring 42 is mounted such that the roller support assemblies 46 and 48 are located near the ring portion of the ring 42 and the wheels 46B and 48B are located slightly above the ring 42. Rotational driving apparatus 27, drive gear ring 36, and capacitor ring 40 are coupled together as an assembly 62, and the assembly 62 is placed on and supported by the roller assemblies 46 and 48. The vertical wheels 48B support the weight of the assembly 62, and the vertical roller assemblies 48 allow rotation of the assembly 62. The horizontal wheels 46B maintain rotation of the assembly 62 along a generally single central vertical axis, that is, the assembly 62 will not wobble along various vertical axes when it is being rotated.

The rotational driving mechanism 44 has a drive gear 45, and the rotational driving mechanism 44 is generally mounted to the bottom of the chamber 52 near an outer area of the periphery of the stationary ring 42. The drive gear 45 is able to engagingly couple to the drive gear ring 36 to controllably drive the assembly 62. The rotational driving mechanism 44 causes the drive gear 45 to rotate in the controlled direction which, in turn, drives and rotates the assembly 62. The use of rings allows for a generally open central area where the work holders 10 are mounted and where the driving components are located. The assembly 62 is driven at the periphery by driving components that are located and mounted at this periphery. Thus, the present setup of locating components and assemblies at a periphery further away from the plating apparatus 56 allows for an open central area at or near the work holders 10 and driving components, which are then generally free or minimized in exposure from plating deposit material.

The assembly 62 rotates in a counter-clockwise direction as shown in FIG. 1. (It may also rotate in a clockwise direction.) Work holders 10 are coupled to the assembly 62. Referring to FIGS. 1 and 6A–6C, the flipper control mechanism 31 selectively controls and actuates to flip respective work holders 10. The flipper control mechanism 31 has an actuating mechanism 35 and a flip lever 32. The flip lever 32 has a flipper engaging member 34 that engages to the flip gear 14 of a work holder 10. The flip lever 32 is hingedly coupled to the actuating mechanism 35, and the actuating mechanism 35 provides selective control of the flip lever 32 between an engaging position and a non-engaging position. The actuating mechanism 35 selectively activates the flip lever 32 to engage a work holder 10 when that work holder 10 is to be flipped. The actuating mechanism 35 selectively deactivates the flip lever 32 to disengage a work holder 10 when that work holder 10 is not to be flipped.

In other words, when a work holder 10 is to be flipped, the flip lever 32 is engaged by positioning it into the path of the oncoming flip gear 14 of the work holder 10. When a work holder 10 is not to be flipped, the flip lever 32 is disengaged by positioning it out of the way of the path of the oncoming flip gear 14 of the work holder 10. FIGS. 6A to 6C show an example of how a work holder 10 is flipped from a non-plating position to a plating position by the engaged flip lever 32 when the flip lever 32 is positioned into the path of the oncoming flip gear 14. FIG. 6A shows that the mask holder 12 with masked substrates or work pieces 11 is in a non-plating position, that is, in an initial vertically upright position. As the assembly 62 is rotated, the lower engaging member 16 of the flip gear 14 arrives and makes initial contact at its engaging edge 18 with the flipper engaging member 34 of flip lever 32 as shown in FIG. 6A. As the assembly 62 continues to rotate, the flipper engaging member 34 continues to be in contact with the engaging member 16 of flip gear 14, and the mask holder 12 begins to be rotated and flipped as shown in FIG. 6B. FIG. 6B shows that the flip gear 14 and the mask holder 12 have been rotated forty five degrees. The rotation of the assembly 62 continues until flipper engaging member 34 contacts the flipper lobe 20 of the flip gear 14 as shown in FIG. 6C. At this point, the flip gear 14 and the mask holder 12 have been rotated ninety degrees from its initial position, and the mask holder 12 is now in a horizontal plating position. The flipper lobe 20 guides and positions the flipper gear 14 as the flipper lobe 20 is in contact with the flipper engaging member 34 so that the mask holder 12 is placed in a properly rotated position. The rotation of the assembly 62 continues until the flip gear 14 has moved passed away from the flip lever 32 as shown in FIG. 6C. The flip lever 32 either may be left engaged in the oncoming path for the next work holder 10 to be flipped or may be disengaged if the next work holder 10 is not to be flipped. If this mask holder 12, however, is to be flipped back to the non-plating position, then the flip lever 32 is engaged for the next revolution of the assembly 62 for that mask holder 12.

One full revolution of the assembly 62 allows for a ninety degree rotation of a work holder 10 by an engaged flip lever 32. Two full revolutions of the assembly 62 allows for a one hundred eighty degree rotation of a work holder 10 by an engaged flip lever 32. Three full revolutions of the assembly 62 allows for a two hundred seventy degree rotation of a work holder 10 by an engaged flip lever 32. Four full revolutions of the assembly 62 allows for a three hundred sixty degree rotation of a work holder 10 by an engaged flip lever 32. The flip lever 32 is controlled and/or programmed to either engage to or disengage from a particular work holder 10 during a desired revolution of the assembly 62. This control of the flip lever 32 allows the work holder 10 with mask holder 12 holding masked substrates or work pieces 11 to be independently and selectively flipped at desired times (i.e. during desired revolution(s)), that is, some of the mask holders 12 may be flipped to a plating position while others are flipped to a non-plating position for a particular revolution of assembly 62. Furthermore, this control of the flip lever 32 further allows the work holder 10 to be flipped or rotated to a plating position or a non-plating position when needed or desired. Therefore, depending on the amount of deposit material to be plated on a certain masked substrate or work piece 11, the base plater apparatus 24 is able to selectively flip those work holders 10 having masked substrates or work pieces 11 that need to be plated to plating positions during a revolution of the assembly 62 and place those work holder 10 to non-plating positions that have masked substrates or work pieces 11 that do not need to be plated during that same revolution. The base plater apparatus 24 may have a controller or computer that is pre-programmed to determine when certain work holders 10 are to be placed in the plating and non-plating positions for particular revolutions of assembly 62. The base plater apparatus 24 also has components, devices, or assemblies for determining and timing the execution and actuation of the flip lever 32, especially when a work holder 10 is approaching the flip lever 32.

FIGS. 7 and 8 show the crystal monitor 26 coupled to the assembly 62. The crystal monitor 26 is mounted and coupled to the rotatable ring 28 of the rotational driving apparatus 27. The crystal monitor 26 is electrically coupled to the capacitor ring 40 via a pogo contact 64. The pogo contact 64 is attached to crystal monitor 26, and the pogo contact 64 inserts through an opening through the rotatable ring 28 and the drive gear 36. The pogo contact 64 has a contact lead 66 that is coupled to the capacitor ring 40. The assembly 62 is mounted on the roller assemblies 46 and 48 and are supported thereat as described earlier. The assembly 62 is driven and rotated by the drive gear 45 of the driving mechanism 44, and the assembly 62 is positioned and rotated above the stationary ring 42 such that a capacitive gap 68 exists between the capacitor ring 40 and the stationary ring 42. The stationary ring 42 is coupled to a control circuit 58. Therefore, the crystal monitor 26 is able to be rotated on the rotatable ring 28 and also be capacitvely coupled to the control circuit 58. The use of these capacitively coupled rings provides an unique capacitive coupling device and also provides a generally open central area 60 that is generally free from obstructions that may adversely affect the plating process and/or the surface or components of the base plater apparatus 24.

The crystal monitor 26 monitors the levels of deposit materials being plated on masked substrates or work pieces 11 held by work holders 10. The crystal monitor 26 is mounted in the same rotational plane and same peripheral area as the work holders 10 to obtain very accurate readings of the plating levels. The readings are taken by the crystal monitor 26. The control circuit 58 that is capacitively coupled to the crystal monitor 26 controls the amount plating of the base plater apparatus 24 depending on the reading communicated from the crystal monitor 26 to the control circuit 58. The control circuit 58 also controls the actuation and deactuation of the flipper control mechanism 31 to flip the work holders 10 as needed or desired or as according to programmed instructions.

The preferred embodiment of the invention is described above in the Figures and Detailed Description. Unless specifically noted, it is the intention of the inventor that the words and phrases in the specification and claims be given the ordinary and accustomed meanings to those of ordinary skill in the applicable art(s). The foregoing description of a preferred embodiment and best mode of the invention known to applicant at the time of filing the application has been presented for the purposes of illustration and description. It is not intended to be exhaustive or to limit the invention to the precise form disclosed, and many modifications and variations are possible in the light of the above teaching. The embodiment was chosen and described in order to best explain the principles of the invention and its practical application and to enable others skilled in the art to best utilize the invention in various embodiments and with various modifications as are suited to the particular use contemplated. Also, the present invention is not in any way limited to the specific embodiments or configurations presented in this specification.

What is claimed is:

1. A selectively rotatable work holder for a base plater or a vacuum deposition apparatus comprising:

a rotatable mask holder that is able to rotatably couple to a rotatable driven plate of the base plater or the vacuum deposition apparatus wherein the rotatable mask holder is able to hold at least one mask or work piece and be selectively rotated between at least one plating position and at least one non-plating position, and a flip gear having at least one engaging member wherein the flip gear is coupled to the rotatable mask holder wherein the at least one engaging member is able to receive and be selectively engaged by a flipper lever for selectively flipping the rotatable mask holder.

2. The selectively rotatable work holder according to claim 1 further comprising:

a rotational shaft that is able to rotatably couple to the rotatable driven plate and wherein one end of the shaft is coupled to the flip gear and another end of the shaft is coupled to the rotatable mask holder.

3. The selectively rotatable work holder according to claim 1 wherein an engaging edge of the at least one engaging member is able to contact the flip lever to rotate the flip gear.

4. The selectively rotatable work holder according to claim 3 wherein the engaging edge further comprises:

at least one flipper lobe for guiding and positioning the flipper gear so that the rotatable mask holder is placed in a properly rotated position.

5. The selectively rotatable work holder according to claim 1 wherein the at least one engaging member is four engaging members.

6. The selectively rotatable work holder according to claim 5 wherein the four engaging members are configured and spaced apart to form a generally cross shape.

7. The selectively rotatable work holder according to claim 5 wherein the four engaging members are configured and spaced apart such that the rotatable mask holder is able to rotate in generally ninety degree increments wherein the generally ninety degree increments define the at least one plating position and the at least one non-plating position for the rotatable mask holder.

8. The selectively rotatable work holder according to claim 1 further comprises:

a mask holder bracket mountable to the rotatable driven plate of the base plater or the vacuum deposition apparatus wherein the rotatable mask holder and the flip gear are rotatably coupled to the mask holder bracket.

9. A capactive coupling device for coupling a rotating electronic device to a control circuit of a base plater or a vacuum deposition apparatus comprising:

a rotating capacitor ring having a generally central open area wherein the rotating electronic device is able to couple to the rotating ring, a stationary capacitor ring having a generally central open area wherein the stationary ring is able to couple to the control circuit, and wherein the rotating capacitor ring is positioned and rotated relative to the stationary ring wherein a capacitive coupling gap exists between the rotating capacitor ring and the stationary ring and wherein the rotating electronic device is able to be rotated and also be capactively coupled to the control circuit.

10. The capactive coupling device according to claim 9 further comprising:

at least one rotational driving mechanism drivingly coupled to the rotating capacitor ring for rotating the rotating capacitor ring.

11. The capactive coupling device according to claim 10 wherein the at least one rotational driving mechanism is drivingly coupled at a general periphery of the rotating capacitor ring.

12. A base plater or a vacuum deposition apparatus comprising:

a vacuum deposition chamber for plating masked substrates or work pieces, a lid coupled to the vacuum deposition chamber, a plating apparatus located within the vacuum deposition chamber so that the plating apparatus is able to plate and deposit material on the masked substrates or work pieces, a rotational driving apparatus coupled to a rotational driving mechanism, at least one work holder apparatus coupled to the rotational driving apparatus wherein the at least one work holder comprises at least one selectively rotatable work holder, and at least one flipper control mechanism selectively engagable to the at least one selectively rotatable work holder for selectively rotating the at least one selectively rotatable work holder between at least one plating position and at least one non-plating position.

13. The base plater or the vacuum deposition apparatus according to claim 12:

wherein the rotational driving apparatus further comprises a rotatable driven plate, and wherein each of the at least one selectively rotatable work holder further comprises:

a rotatable mask holder that is rotatably coupled to the rotatable driven plate wherein the rotatable mask holder is able to hold at least one mask or work piece and is able to be selectively rotated between at least one plating position and at least one non-plating position, and a flip gear having at least one engaging member wherein the flip gear is coupled to the rotatable mask holder wherein the at least one engaging member is able to receive and be engaged by the flipper control mechanism for flipping the rotatable mask holder.

14. The base plater or the vacuum deposition apparatus according to claim 13 further comprises:

a rotational shaft rotatably coupled to the rotatable driven plate and wherein one end of the shaft is coupled to the flip gear and another end of the shaft is coupled to the rotatable mask holder.

15. The base plater or the vacuum deposition apparatus according to claim 13 wherein an engaging edge of the at least one engaging member is engagable to the flipper control mechanism to rotate the flip gear.

16. The base plater or the vacuum deposition apparatus according to claim 15 wherein the engaging edge further comprises:
at least one flipper lobe for guiding and positioning the flipper gear so that the rotatable mask holder is placed in a properly rotated position.

17. The base plater or the vacuum deposition apparatus according to claim 13 wherein the at least one engaging member is four engaging members.

18. The base plater or the vacuum deposition apparatus according to claim 17 wherein the four engaging members are configured and spaced apart to form a generally cross shape.

19. The base plater or the vacuum deposition apparatus according to claim 17 wherein the four engaging members are configured and spaced apart such that the rotatable mask holder is able to rotate in generally ninety degree increments wherein the generally ninety degree increments define the at least one plating position and the at least one non-plating position for the rotatable mask holder.

20. The base plater or the vacuum deposition apparatus according to claim 13 further comprises:
a mask holder bracket mounted to the rotatable driven plate wherein the rotatable mask holder and the flip gear are rotatably coupled to the mask holder bracket.

21. The base plater or the vacuum deposition apparatus according to claim 12 wherein the flipper control mechanism further comprises:
an actuating mechanism that is selectively controlled,
a flip lever coupled to the actuating mechanism, and
wherein the actuating mechanism selectively activates the flip lever to engage and flip the at least one selectively rotatable work holder and wherein the actuating mechanism also selectively deactivates the flip lever to disengage the at least one selectively rotatable work holder.

22. The base plater or the vacuum deposition apparatus according to claim 21 wherein the at least one selectively rotatable work holder is a plurality of selectively rotatable work holders and each of the plurality of selectively rotatable work holders is individually and selectively controlled in position by selectively controlling the flipper control mechanism.

23. The base plater or the vacuum deposition apparatus according to claim 12 further comprises:
a rotating electronic device coupled to the rotational driving apparatus, and
a control circuit capacitively coupled to the rotating electronic device wherein the control circuit controls operations of the base plater or the vacuum deposition apparatus.

24. The base plater or the vacuum deposition apparatus according to claim 23 further comprises:
a capactive coupling device for coupling the rotating electronic device to the control circuit.

25. The base plater or the vacuum deposition apparatus according to claim 24 wherein the capacitive coupling device further comprises:
a rotating capacitor ring having a generally central open area wherein the rotating electronic device is able to couple to the rotating ring,
a stationary capacitor ring having a generally central open area wherein the stationary ring is able to couple to the control circuit, and
wherein the rotating capacitor ring is positioned and rotated relative to the stationary ring wherein a capacitive coupling gap exists between the rotating capacitor ring and the stationary ring and wherein the rotating electronic device is able to be rotated and also be capactively coupled to the control circuit.

26. The base plater or the vacuum deposition apparatus according to claim 25 wherein the rotational driving mechanism is drivingly coupled to the rotating capacitor ring for rotating the rotating capacitor ring.

27. The base plater or the vacuum deposition apparatus according to claim 25 wherein the rotational driving mechanism is drivingly coupled at a general periphery of the rotating capacitor ring.

28. The base plater or the vacuum deposition apparatus according to claim 12 wherein the rotational driving mechanism is drivingly coupled at a general periphery of the rotational driving apparatus.

29. A base plater or a vacuum deposition apparatus comprising:
a vacuum deposition chamber for plating masked substrates or work pieces,
a lid coupled to the vacuum deposition chamber,
a plating apparatus located within the vacuum deposition chamber so that the plating apparatus is able to plate and deposit material on the substrates or the work pieces,
a rotational driving apparatus coupled to a rotational driving mechanism,
at least one work holder apparatus coupled to the rotational driving apparatus,
a rotating electronic device coupled to the rotational driving apparatus,
a control circuit for controlling operations of the base plater or the vacuum deposition apparatus, and
a capactive coupling device for coupling the rotating electronic device to the control circuit wherein the capacitive coupling device further comprises:
a rotating capacitor ring having a generally central open area wherein the rotating electronic device is able to couple to the rotating ring,
a stationary capacitor ring having a generally central open area wherein the stationary ring is able to couple to the control circuit, and
wherein the rotating capacitor ring is positioned and rotated relative to the stationary ring wherein a capacitive coupling gap exists between the rotating capacitor ring and the stationary ring and wherein the rotating electronic device is able to be rotated and also be capactively coupled to the control circuit.

30. The base plater or the vacuum deposition apparatus according to claim 29 wherein the rotational driving mechanism is drivingly coupled to the rotating capacitor ring for rotating the rotating capacitor ring.

31. The base plater or the vacuum deposition apparatus according to claim 29 wherein the rotational driving mechanism is drivingly coupled at a general periphery of the rotating capacitor ring.

32. A method of using a base plater or a vacuum deposition apparatus having a vacuum deposition chamber for plating masked substrates or work pieces, a lid coupled to the vacuum deposition chamber, a plating apparatus located within the vacuum deposition chamber so that the plating apparatus is able to plate and deposit material on the masked substrates or work pieces, a rotational driving apparatus coupled to a rotational driving mechanism, at least one work holder apparatus coupled to the rotational driving apparatus wherein the at least one work holder comprises at least one selectively rotatable work holder, and at least one flipper control mechanism selectively engagable to at least one flip gear coupled to the at least one selectively rotatable work holder for selectively rotating the at least one selectively rotatable work holder, comprising the steps of:

mounting the masked substrates or work pieces in the at least one selectively rotatable work holder, using the rotational driving mechanism to rotate the rotational driving apparatus, selectively engaging the at least one flipper control mechanism to the at least one flip gear to selectively rotate the at least one selectively rotatable work holder between at least one plating position and at least one non-plating position, and plating the masked substrates or work pieces in the at least one selectively rotatable work holder that are in the at least one plating position.

33. The method according to claim 32 wherein the selectively engaging step further comprises the step of:

selectively engaging the at least one flipper control mechanism to the at least one flip gear to selectively rotate the at least one selectively rotatable work holder to predetermined degree increments wherein the predetermined degree increments define the at least one plating position and the at least one non-plating position for the rotatable mask holder.

34. The method according to claim 33 wherein the predetermined degree increments are ninety degree increments.

35. A method of using a capacitively coupling device for coupling a rotating electronic device to an electronic circuit comprising the steps of:

providing the capacitive coupling device with a rotating capacitor ring having a generally central open area and a stationary capacitor ring having a generally central open area, coupling the rotating electronic device to the rotating capacitor ring, coupling the electronic circuit to the stationary capacitor ring, and positioning and rotating the rotating capacitor ring relative to the stationary ring wherein a capacitive coupling gap exists between the rotating capacitor ring and the stationary ring and wherein the rotating electronic device is rotated and capactively coupled to the electronic circuit.

36. The method according to claim 35 wherein the rotating step further comprises the step of:

drivingly rotating the rotating capacitor ring at a general periphery.

* * * * *